(12) United States Patent
Lee

(10) Patent No.: US 10,546,906 B2
(45) Date of Patent: Jan. 28, 2020

(54) THIN FILM TRANSISTOR ARRAY SUBSTRATE AND ORGANIC LIGHT-EMITTING DISPLAY DEVICE INCLUDING THE SAME

(71) Applicant: SAMSUNG DISPLAY CO., LTD., Yongin-si, Gyeonggi-do (KR)

(72) Inventor: Won-Se Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/138,884

(22) Filed: Sep. 21, 2018

(65) Prior Publication Data

US 2019/0027546 A1  Jan. 24, 2019

Related U.S. Application Data

(63) Continuation of application No. 15/271,886, filed on Sep. 21, 2016, now Pat. No. 10,084,029, which is a continuation of application No. 13/963,987, filed on Aug. 9, 2013, now Pat. No. 9,478,586.

(30) Foreign Application Priority Data

Mar. 27, 2013 (KR) .................. 10-2013-0033085

(51) Int. Cl.
*H01L 27/32* (2006.01)
*G09G 3/3233* (2016.01)
*H01L 27/12* (2006.01)

(52) U.S. Cl.
CPC ....... *H01L 27/3262* (2013.01); *G09G 3/3233* (2013.01); *H01L 27/3216* (2013.01); *H01L 27/3218* (2013.01); *H01L 27/3276* (2013.01); *G09G 2300/0452* (2013.01);
(Continued)

(58) Field of Classification Search
CPC ............. H01L 27/3211; H01L 27/3216; H01L 27/3218; H01L 27/3262
See application file for complete search history.

(56) References Cited

U.S. PATENT DOCUMENTS 7,365,488 B2  4/2008  Lee et al.
8,253,323 B2  8/2012  Sung et al.
8,319,906 B2  11/2012  Enda et al.
(Continued)

FOREIGN PATENT DOCUMENTS

GB       2483764 A      3/2012
JP       2003-142277    5/2003
(Continued)

OTHER PUBLICATIONS

U.S. Office action dated Mar. 29, 2012, for cross reference U.S. Appl. No. 12/416,501 (now U.S. Pat. No. 8,253,323), (13 pages).

*Primary Examiner* — Jose R Diaz
(74) *Attorney, Agent, or Firm* — Lewis Roca Rothgerber Christie LLP

(57) ABSTRACT

A thin film transistor array substrate having a pixel arrangement structure includes a first sub-pixel for displaying a first color and a second sub-pixel for displaying a second color alternately located in a first column, and a third sub-pixel for displaying a third color in a second column adjacent to the first column, and via holes of the first through third sub-pixels in a same row are at different positions.

20 Claims, 9 Drawing Sheets

(52) U.S. Cl.
CPC ......... *G09G 2300/0465* (2013.01); *G09G 2300/0819* (2013.01); *G09G 2310/0262* (2013.01); *H01L 27/124* (2013.01)

(56) References Cited

U.S. PATENT DOCUMENTS

| | | | |
|---|---|---|---|
| 8,338,832 B2 * | 12/2012 | Kim | ............ H01L 27/3202 257/59 |
| 8,552,635 B2 | 10/2013 | Kim et al. | |
| 9,478,586 B2 | 10/2016 | Lee | |
| 2004/0036421 A1 | 2/2004 | Arnold et al. | |
| 2005/0057460 A1 | 3/2005 | Lee et al. | |
| 2005/0242712 A1 | 11/2005 | Sung | |
| 2007/0015429 A1 | 1/2007 | Maeda et al. | |
| 2009/0289963 A1 | 11/2009 | Minami et al. | |
| 2011/0291550 A1 | 12/2011 | Kim et al. | |
| 2012/0056531 A1 | 3/2012 | Park et al. | |

FOREIGN PATENT DOCUMENTS

| | | |
|---|---|---|
| JP | 2005-209421 | 8/2005 |
| JP | 2006-120473 | 5/2006 |
| JP | 2006-253015 | 9/2006 |
| JP | 2007-026852 | 2/2007 |
| JP | 2007-035580 | 2/2007 |
| JP | 2007-220577 | 8/2007 |
| JP | 4623138 B2 | 2/2011 |
| JP | 2011-249334 A | 12/2011 |
| KR | 10-2005-0021718 A | 3/2005 |
| KR | 10-0497094 B1 | 6/2005 |
| KR | 10-2006-0040260 | 5/2006 |
| KR | 10-0635056 | 10/2006 |
| KR | 10-0787454 B1 | 12/2007 |
| KR | 10-2010-0001598 A | 1/2010 |
| KR | 10-2012-0025885 A | 3/2012 |
| WO | WO 2008/096483 A1 | 8/2008 |

\* cited by examiner

THIN FILM TRANSISTOR ARRAY SUBSTRATE AND ORGANIC LIGHT-EMITTING DISPLAY DEVICE INCLUDING THE SAME

CROSS-REFERENCE TO RELATED APPLICATION

This application is a continuation of U.S. patent application Ser. No. 15/271,886, filed Sep. 21, 2016, which is a continuation of U.S. patent application Ser. No. 13/963,987, filed Aug. 9, 2013, now U.S. Pat. No. 9,478,586, which claims priority to and the benefit of Korean Patent Application No. 10-2013-0033085, filed Mar. 27, 2013, the entire content of all of which is incorporated herein by reference.

BACKGROUND

1. Field

The present invention relates to a thin film transistor array substrate and an organic light-emitting display device including the same.

2. Description of Related Art

An organic light-emitting display device is self-emissive, and unlike a liquid crystal display device, the organic light-emitting display device does not require a separate light source, thereby having a reduced thickness and weight. Also, the organic light-emitting display device has beneficial characteristics including low power consumption, high brightness, a quick response time, or the like.

In general, the organic light-emitting display device includes gate lines that are disposed on a substrate and that extend in one direction, data lines that extend and cross the gate lines, a pixel circuit that is connected (or coupled) to each of the gate lines and each of the data lines, and an organic light emitting diode (OLED) that is connected (or coupled) to the pixel circuit. Recently, when a high resolution display is required, it may be necessary to increase an aperture ratio of pixels.

While high resolution pixels for the high resolution display may be required, openings of a pixel definition layer for ensuring a life span of pixels are approaching a limit due to a design constraint (or rule) of a metal wiring in the pixel and a gap between the pixel definition layers, that is, the restriction of a margin for deposition using a fine metal mask (FMM).

SUMMARY

Aspects of the present invention provide a high resolution organic light-emitting display device for improving a life span of the display by reducing a space limitation of via holes that are factors (e.g., critical factors) when designing a high resolution pixel.

According to an aspect of the present invention, there is provided a thin film transistor array substrate having a pixel arrangement structure including a first sub-pixel for displaying a first color and a second sub-pixel for displaying a second color alternately located in a first column, and a third sub-pixel for displaying a third color in a second column adjacent to the first column, and via holes of the first through third sub-pixels in a same row are at different positions.

The via holes of the first through third sub-pixels may be in a zigzag pattern.

The third sub-pixel may have a height that is two times or more of the height of the first sub-pixel or the second sub-pixel in a column direction.

The first sub-pixel may include a first pixel electrode, and the first pixel electrode may include a first emissive portion and a first non-emissive portion around the first emissive portion, and a first pixel circuit coupled to the first pixel electrode through a first via hole; the second sub-pixel may include a second pixel electrode, and the second pixel electrode may include a second emissive portion and a second non-emissive portion around the second emissive portion, and a second pixel circuit coupled to the second pixel electrode through a second via hole; and the third sub-pixel may include a third pixel electrode, and the third pixel electrode may include a third emissive portion and a third non-emissive portion around the third emissive portion, and a third pixel circuit coupled to the third pixel electrode through a third via hole.

The first via hole may be spaced apart in a left lower direction from the first emissive portion, the second via hole may be spaced apart in a right upper direction from the second emissive portion, and the third via hole may be spaced apart in an upper direction of the third emissive portion.

The thin film transistor array substrate may further include: a planarization layer covering the first through third pixel circuits and in which the first through third via holes are formed; a pixel definition layer covering the first through third via holes and the first through third non-emissive portions of the first through third pixel electrodes, and the first through third pixel electrodes may be on the planarization layer; an organic layer including an emissive layer on the first through third emissive portions of the first through third pixel electrodes; and an opposite electrode on the organic layer.

Each of the first through third pixel circuits may include: a capacitor including a first electrode and a second electrode on the first electrode; a data line extending in a first direction on the capacitor and overlapping a portion of the capacitor, the data line for transmitting a data signal; and a driving voltage line between the capacitor and the data line, and including a first line extending in the first direction and a second line extending in a second direction perpendicular to the first direction, the driving voltage line for supplying a driving voltage.

The second electrode of the capacitor may be electrically coupled to the driving voltage line through a contact hole.

The first line of the driving voltage line may be coupled between pixel circuits that are adjacent in the first direction, and the second line of the driving voltage line may be coupled between pixel circuits that are adjacent in the second direction, so that the driving voltage line has a mesh structure.

The first sub-pixel may be a red sub-pixel, the second sub-pixel may be a green sub-pixel, and the third sub-pixel may be a blue sub-pixel.

According to another aspect of the present invention, there is provided an organic light-emitting display device including: a first sub-pixel including a first pixel electrode and a first pixel circuit in a first column, and the first pixel electrode includes a first emissive portion and a first non-emissive portion around the first emissive portion; a second sub-pixel including a second pixel electrode and a second pixel circuit and located alternately with the first sub-pixel in the first column, and the second pixel electrode includes a second emissive portion and a second non-emissive portion around the second emissive portion; and a third sub-pixel including a third pixel electrode and a third pixel circuit in a second column adjacent to the first column, and the third pixel electrode includes a third emissive portion and a third non-emissive portion around the third emissive portion, and via holes of the first through third sub-pixels in a same row are at different positions.

The organic light-emitting display device may further include a planarization layer covering the first through third pixel circuits and in which the first through third via holes are formed, and the first via hole may couple the first pixel electrode to the first pixel circuit, the second via hole may couple the second pixel electrode to the second pixel circuit, and the third via hole may couple the third pixel electrode to the third pixel circuit.

The first through third via holes may be formed in a zigzag pattern.

The third sub-pixel may have a height that is two times or more of the height of the first sub-pixel or the second sub-pixel in a column direction.

The first via hole may be spaced apart in a left lower direction from the first emissive portion, the second via hole may be spaced apart in a right upper direction from the second emissive portion, and the third via hole may be spaced apart in an upper direction of the third emissive portion.

The organic light-emitting display device may further include: a pixel definition layer covering the first through third via holes and the first through third non-emissive portions of the first through third pixel electrodes, and the first through third pixel electrodes may be on the planarization layer; an organic layer including an emissive layer on the first through third emissive portions of the first through third pixel electrodes; and an opposite electrode on the organic layer.

Each of the first through third pixel circuits may include: a capacitor including a first electrode and a second electrode on the first electrode; a data line extending in a first direction on the capacitor and overlapping a portion of the capacitor, the data line for transmitting a data signal; and a driving voltage line between the capacitor and the data line, and including a first line extending in the first direction and a second line extending in a second direction perpendicular to the first direction, the driving voltage line for supplying a driving voltage.

The second electrode of the capacitor may be electrically coupled to the driving voltage line through a contact hole.

The first line of the driving voltage line may be coupled between pixel circuits that are adjacent in the first direction, and the second line of the driving voltage line may be coupled between pixel circuits that are adjacent in the second direction, so that the driving voltage line has a mesh structure.

The first sub-pixel may be a red sub-pixel, the second sub-pixel may be a green sub-pixel, and the third sub-pixel may be a blue sub-pixel.

According to aspects of the present invention, by forming via holes of sub-pixels of different colors, which constitute a unit pixel, at different positions, the sizes of pixel electrodes of the sub-pixels and an aperture ratio of the unit pixel may be increased while maintaining an interval (e.g., a required interval) between each of the sub-pixels.

BRIEF DESCRIPTION OF THE DRAWINGS

The above and other features and aspects of the present invention will become more apparent by describing in detail example embodiments thereof with reference to the attached drawings in which.

DETAILED DESCRIPTION

Figure 1:
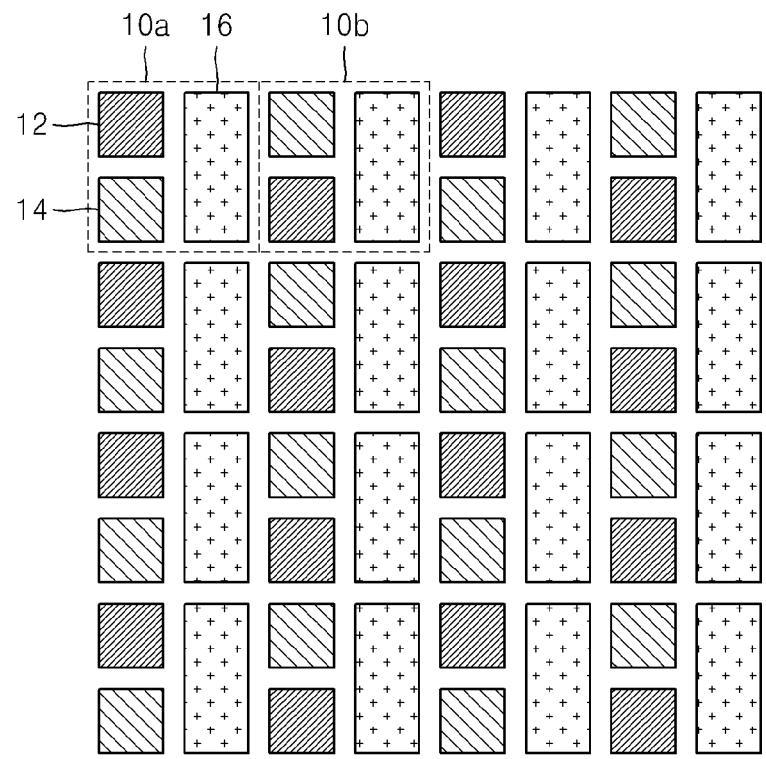
FIG. 1 is a plan view illustrating a pixel arrangement structure of an organic light-emitting display device according to an embodiment of the present invention.

Hereinafter, embodiments of the present invention will be described in detail by explaining example embodiments of the invention with reference to the attached drawings. The invention may, however, be embodied in many different forms, and should not be construed as being limited to the embodiments set forth herein; rather, these embodiments are provided so that this disclosure will be more thorough and complete, and will more fully convey the concept of the invention to those skilled in the art.

In the following description, well-known functions or constructions may not be described in detail since they would obscure the invention with unnecessary detail, and like reference numerals in the drawings denote like or similar elements throughout the specification.

Also, the thicknesses and sizes of elements in the drawings may be arbitrarily shown for convenience of description, thus, the spirit and scope of the present invention are not necessarily defined by the drawings. In the drawings, the thicknesses of layers and regions may be exaggerated for clarity. Throughout the specification, it will also be understood that when an element such as layer, region, or substrate is referred to as being "on" another element, it can be directly on the other element, or intervening elements may also be present.

Also, when a part "includes" or "comprises" an element, unless there is a particular description contrary thereto, the part can further include other elements, not excluding the other elements. In addition, throughout the specification, it will also be understood that when an element is referred to as being "above" a target element, it means that the element can be above or below the target element and it does not mean that the element is always above the target element in a gravitational direction. As used herein, the term "and/or" includes any and all combinations of one or more of the associated listed items.

FIG. 1 is a plan view illustrating a pixel arrangement structure of an organic light-emitting display device according to an embodiment of the present invention.

Referring to FIG. 1, the pixel arrangement structure of the organic light-emitting display device according to an embodiment of the present invention has a structure in which a plurality of unit pixels 10a and 10b formed of first through third sub-pixels 12, 14, and 16 are alternately and repeatedly arranged in a row direction on a thin film transistor array substrate. In the structure, the same unit pixels are repeatedly arranged in a column direction.

According to an embodiment, the first sub-pixel 12 emits a first color light, the second sub-pixel 14 emits a second color light, and the third sub-pixel 16 emits a third color light. The first sub-pixel 12 and the second sub-pixel 14 have the same size, and constitute a left column or a right column of each of the unit pixels 10a and 10b. In FIG. 1, the first sub-pixel 12 and the second sub-pixel 14 constitute a left column of each of the unit pixels 10a and 10b. The third sub-pixel 16 has a height that is more than two times that of the first sub-pixel 12 (or the second sub-pixel 14) in the column direction, and constitutes a right column or a left column of each of the unit pixels 10a and 10b. In FIG. 1, the third sub-pixel 16 constitutes a right column of each of the unit pixels 10a and 10b.

Positions of the first and second sub-pixels 12 and 14 of the first unit pixel 10a are opposite to those of the first and second sub-pixels 12 and 14 of the second unit pixel 10b. For example, the first sub-pixels 12 in unit pixels 10a and 10b are positioned diagonally from one another and centered around a column in which the third sub-pixels 16 are arranged. The second sub-pixels 14 in unit pixels 10a and 10b also are positioned diagonally from one another and centered around the column, and thus, the first sub-pixels 12 and the second sub-pixels 14 are arranged in a checkered form. Accordingly, the first sub-pixels 12 and the second sub-pixels 14 are alternately arranged in the row direction.

When the pixel arrangement structure of FIG. 1 is used, high resolution may be obtained by a "sub-pixel rendering" method. In addition, when the pixel arrangement structure of FIG. 1 is used, a size of a black matrix may be reduced compared to a conventional stripe arrangement structure, and thus, a higher (or high) aperture ratio may be obtained.

Figure 2:
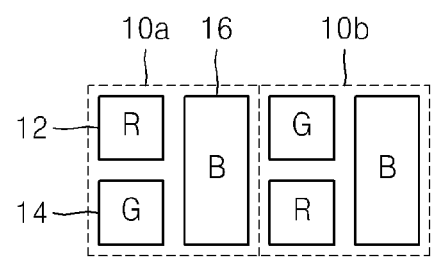
FIG. 2 is a plan view illustrating an example of a color arrangement that is applicable to unit pixels illustrated in FIG. 1.

FIG. 2 is a plan view illustrating an example of a color arrangement that is applicable to the unit pixels 10a and 10b illustrated in FIG. 1.

Referring to FIG. 2, the first sub-pixel 12 is set as a red sub-pixel R, and the second sub-pixel 14 is set as a green sub-pixel G. The third sub-pixel 16 having a larger (e.g., relatively large) size compared to the first sub-pixel 12 and the second sub-pixel 14 is set as a blue sub-pixel B.

Generally, in an organic light-emitting diode (OLED), the blue sub-pixel B has the shortest life span characteristics. Accordingly, in the current embodiment of the present invention, life characteristics may be improved by setting the third sub-pixel 16 having the widest area as the blue sub-pixel B.

Figure 3:
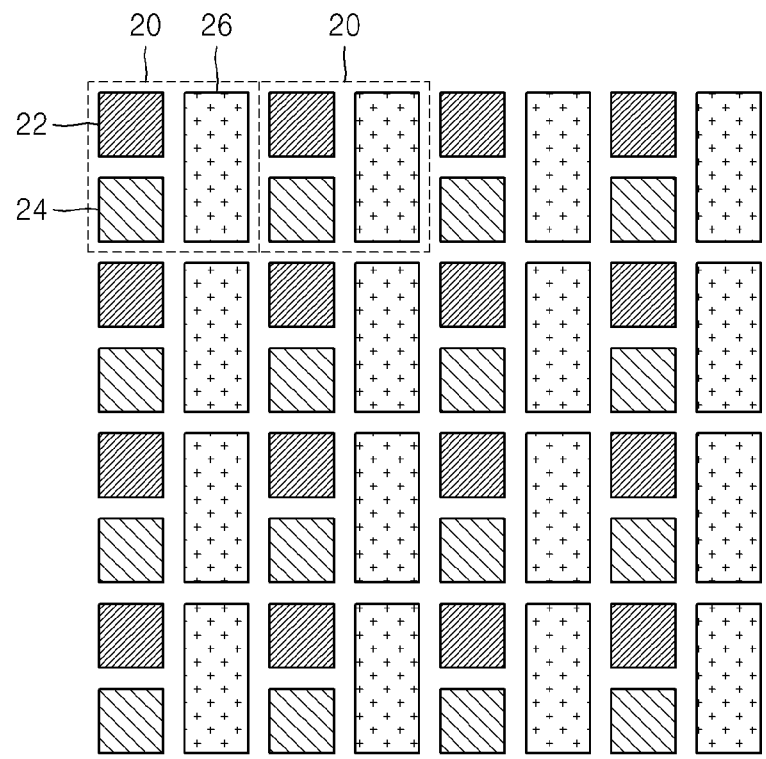
FIG. 3 is a plan view illustrating a pixel arrangement structure of an organic light-emitting display device according to another embodiment of the present invention.

FIG. 3 is a plan view illustrating a pixel arrangement structure of an organic light-emitting display device according to another embodiment of the present invention. Differences between the pixel arrangement structure of FIG. 1 and the pixel arrangement structure of FIG. 3 are mainly described below.

The pixel arrangement structure of FIG. 3 has a structure in which a plurality of unit pixels 20 formed of first through third sub-pixels 22, 24, and 26 are repeatedly arranged in column and row directions on a thin film transistor array substrate. In the structure, the same unit pixels are repeatedly arranged in a column direction.

According to an embodiment, the first sub-pixel 22 and the second sub-pixel 24 have the same size, and constitute a left column or a right column of each of the unit pixels 20. In FIG. 3, the first sub-pixel 22 and the second sub-pixel 24 constitute a left column of each of the unit pixels 20. The third sub-pixel 26 has a height that is more than two times that of the first sub-pixel 22 (or the second sub-pixel 24) in the column direction, and constitutes a right column or a left column of each of the unit pixels 20. In FIG. 3, the third sub-pixel 26 constitutes a right column of each of the unit pixels 20.

The first sub-pixels 22 and the second sub-pixels 24 are alternately arranged in the same column line, the first sub-pixels 22 are repeatedly arranged in the row direction while interposing each of the third sub-pixels 26 between each of the first sub-pixels 22, and the second sub-pixels 24 are repeatedly arranged in the row direction while interposing each of the third sub-pixels 26 between each of the second sub-pixels 24.

Figure 4:
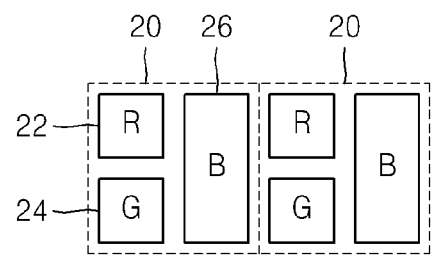
FIG. 4 is a plan view illustrating an example of a color arrangement that is applicable to unit pixels illustrated in FIG. 3.

FIG. 4 is a plan view illustrating an example of a color arrangement that is applicable to the unit pixels 20 illustrated in FIG. 3.

Referring to FIG. 4, the first sub-pixel 22 is set as a red sub-pixel R, and the second sub-pixel 24 is set as a green sub-pixel G. The third sub-pixel 26 having a larger (e.g., relatively large) size compared to the first sub-pixel 22 and the second sub-pixel 24 is set as a blue sub-pixel B.

Generally, in the OLED, the blue sub-pixel B has the shortest life span characteristics. Accordingly, in the current embodiment of the present invention, life characteristics may be improved by setting the third sub-pixel 26 having the widest area as the blue sub-pixel B.

Figure 5:
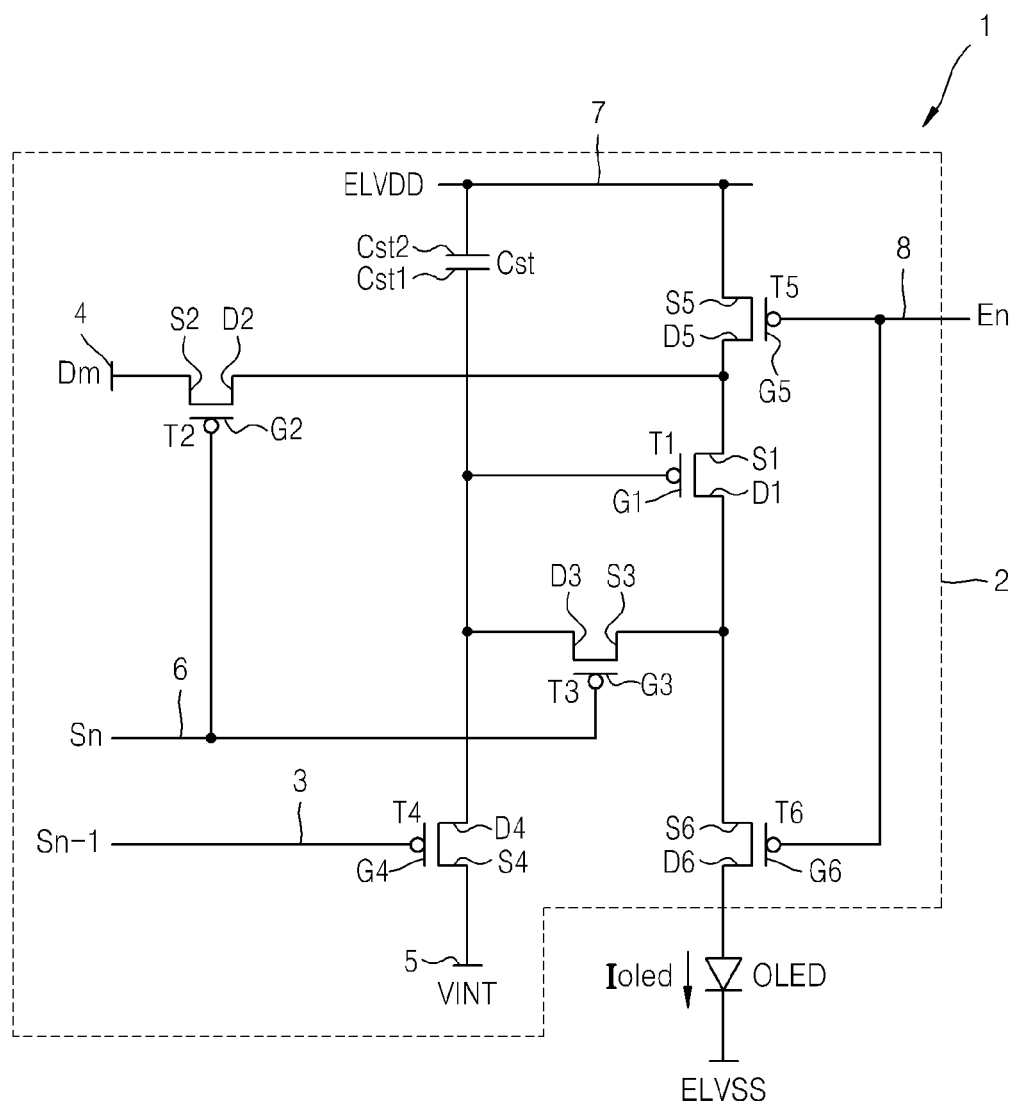
FIG. 5 is an equivalent circuit diagram of a sub-pixel according to an embodiment of the present invention.

FIG. 5 is an equivalent circuit diagram of a sub-pixel 1 according to an embodiment of the present invention.

Referring to FIG. 5, the sub-pixel 1 includes a pixel circuit 2, which includes first through sixth thin film transistors (TFTs) T1 through T6 and a storage capacitor Cst, and an OLED that receives a driving current from the pixel circuit 2 and thus emits light.

The TFTs T1 through T6 respectively include a driving TFT T1, a switching TFT T2, a compensation TFT T3, an initialization TFT T4, a first emission control TFT T5, and a second emission control TFT T6.

The sub-pixel 1 includes a first scan line 6 that transmits a first scan signal Sn to the switching TFT T2 and the compensation TFT T3; a second scan line 3 that transmits a second scan signal Sn-1, which is a previous scan signal, to the initialization TFT T4; an emission control line 8 that transmits an emission control signal En to the first emission control TFT T5 and the second emission control TFT T6; a data line 4 that crosses the first scan line 6 and transmits a data signal Dm; a driving voltage line 7 that transmits a first power voltage ELVDD and is formed substantially (or nearly) in parallel with the data line 4; and an initialization voltage line 5 that transmits an initialization voltage VINT for initializing the driving TFT T1.

A gate electrode G1 of the driving TFT T1 is coupled to a first electrode Cst1 of the storage capacitor Cst. A source electrode S1 of the driving TFT T1 is coupled to the driving voltage line 7 via the first emission control TFT T5. A drain electrode D1 of the driving TFT T1 is electrically coupled to an anode electrode of the OLED via the second emission control TFT T6. The driving TFT T1 receives the data signal Dm according to a switching operation by the switching TFT T2, and then supplies a driving current Ioled to the OLED.

A gate electrode G2 of the switching TFT T2 is coupled to the first scan line 6. A source electrode S2 of the switching TFT T2 is coupled to the data line 4. A drain electrode D2 of the switching TFT T2 is coupled to the source electrode S1 of the driving TFT T1 and is coupled to the driving voltage line 7 via the first emission control TFT T5. The switching TFT T2 is turned on in response to the first scan signal Sn that is transmitted via the first scan line 6, and thus performs a switching operation for transmitting the data signal Dm received via the data line 4 to the source electrode S1 of the driving TFT T1.

A gate electrode G3 of the compensation TFT T3 is coupled to the first scan line 6. A source electrode S3 of the compensation TFT T3 is coupled to the drain electrode D1 of the driving TFT T1 and is coupled to the anode electrode of the OLED via the second emission control TFT T6. A drain electrode D3 of the compensation TFT T3 is coupled to all of the first electrode Cst1 of the storage capacitor Cst, a drain electrode D4 of the initialization TFT T4, and the gate electrode G1 of the driving TFT T1. The compensation TFT T3 is turned on in response to the first scan signal Sn that is transmitted via the first scan line 6, and thus diode-couples the driving TFT T1 by coupling the gate electrode G1 and the drain electrode D1 of the driving TFT T1 to one another.

A gate electrode G4 of the initialization TFT T4 is coupled to the second scan line 3. A source electrode S4 of the initialization TFT T4 is coupled to the initialization voltage line 5. The drain electrode D4 of the initialization TFT T4 is coupled to all of the first electrode Cst1 of the storage capacitor Cst, the drain electrode D3 of the compensation TFT T3, and the gate electrode G1 of the driving TFT T1. The initialization TFT T4 is turned on in response to the second scan signal Sn-1 that is transmitted via the second scan line 3, and thus performs an initialization operation for initializing a voltage of the gate electrode G1 of the driving TFT T1 by transmitting the initialization voltage VINT to the gate electrode G1 of the driving TFT T1.

A gate electrode G5 of the first emission control TFT T5 is coupled to the emission control line 8. A source electrode S5 of the first emission control TFT T5 is coupled to the driving voltage line 7. A drain electrode D5 of the first emission control TFT T5 is coupled to the source electrode S1 of the driving TFT T1 and the drain electrode D2 of the switching TFT T2.

A gate electrode G6 of the second emission control TFT T6 is coupled to the emission control line 8. A source electrode S6 of the second emission control TFT T6 is coupled to the drain electrode D1 of the driving TFT T1 and the source electrode S3 of the compensation TFT T3. A drain electrode D6 of the second emission control TFT T6 is electrically coupled to the anode electrode of the OLED. The first emission control TFT T5 and the second emission control TFT T6 are concurrently (e.g., simultaneously) turned on in response to an emission control signal En that is transmitted via the emission control line 8, so that the first power voltage ELVDD is supplied to the OLED, and thus the driving current Ioled flows through the OLED.

A second electrode Cst2 of the storage capacitor Cst is coupled to the driving voltage line 7. The first electrode Cst1 of the storage capacitor Cst is coupled to all of the gate electrode G1 of the driving TFT T1, the drain electrode D3 of the compensation TFT T3, and the drain electrode D4 of the initialization TFT T4.

A cathode electrode of the OLED is coupled to the second power voltage ELVSS. The OLED receives the driving current Ioled from the driving TFT T1 and then emits light, so that an image may be displayed.

The sub-pixel 1 illustrated in FIG. 5 may be any one of the red sub-pixel R, the green sub-pixel G, and the blue sub-pixel B.

Figure 6:
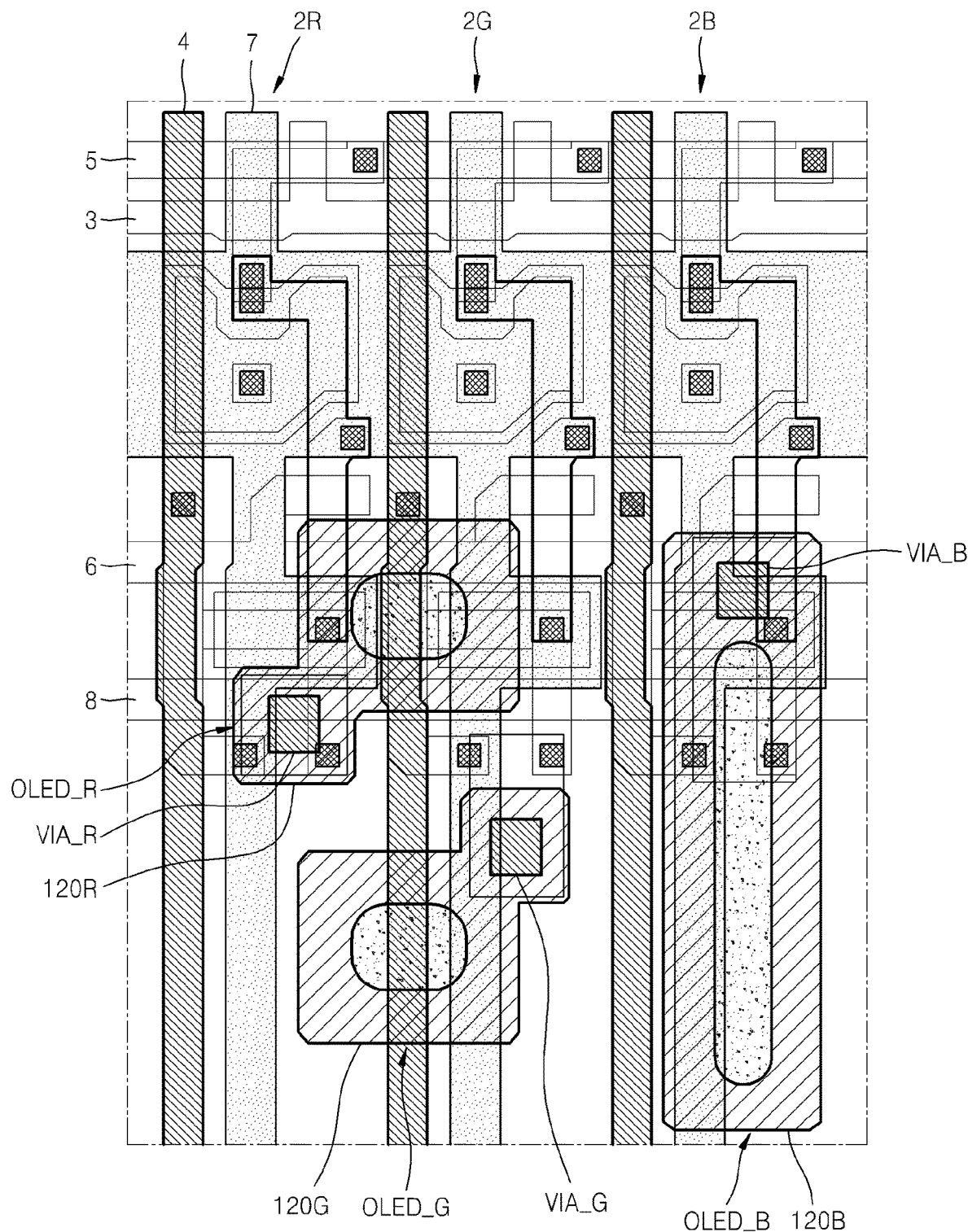
FIG. 6 is a plane view illustrating a unit pixel according to an embodiment of the present invention.

FIG. 6 is a plane view illustrating a unit pixel according to an embodiment of the present invention.

According to an embodiment, the unit pixel includes first through third sub-pixels. In the current embodiment of FIG. 6, the first through third sub-pixels may be the red sub-pixel R, the green sub-pixel G, and the blue sub-pixel B, respectively.

In one embodiment, the red sub-pixel R includes a first pixel circuit 2R that includes first through sixth TFTs T1 through T6 and a storage capacitor Cst, and a red OLED OLED_R that receives a driving current through the first pixel circuit 2R and thus emits light. The green sub-pixel G includes a second pixel circuit 2G that includes first through sixth TFTs T1 through T6 and a storage capacitor Cst, and a green OLED OLED_G that receives a driving current through the second pixel circuit 2G and thus emits light. The blue sub-pixel B includes a third pixel circuit 2B that includes first through sixth TFTs T1 through T6 and a storage capacitor Cst, and a blue OLED OLED_B that receives a driving current through the third pixel circuit 2B and thus emits light. In the red, green, and blue OLEDs OLED_R, OLED_G, OLED_B illustrated in FIG. 6, only an anode electrode and a light-emitting unit are illustrated and a cathode electrode is not illustrated.

The first through third pixel circuits 2R, 2G, and 2B of the respective red, green, and blue sub-pixels R, G, and B, which constitute the unit pixel, are disposed to be adjacent to three columns, respectively, in one row.

According to an embodiment, the red OLED OLED_R is coupled to a second emission control TFT T6 through a via hole VIA_R, and thus is electrically coupled to the first pixel circuit 2R. The green OLED OLED_G is coupled to a second emission control TFT T6 through a via hole VIA_G, and thus is electrically coupled to the second pixel circuit 2G. The blue OLED OLED_B is coupled to a second emission control TFT T6 through a via hole VIA_B, and thus is electrically coupled to the third pixel circuit 2B. In the same row, the positions of the via hole VIA_R of the red sub-pixel R, the via hole VIA_G of the green sub-pixel G, and the via hole VIA_B of the blue sub-pixel B are different from each other.

A first pixel electrode 120R and a second pixel electrode 120G partially overlap with a data line of the second pixel circuit 2G between the first pixel circuit 2R and the second pixel circuit 2G, and are disposed to be adjacent to each other in a column direction. A third pixel electrode 120B is disposed in the third pixel circuit 2B.

By the disposition of via holes of sub-pixels according to the current embodiment of the present invention, the positions of pixel electrodes of the sub-pixels may be varied (e.g., are movable) while maintaining a constant distance between each of the sub-pixels, and an aperture ratio of pixels may be increased.

Figure 7:
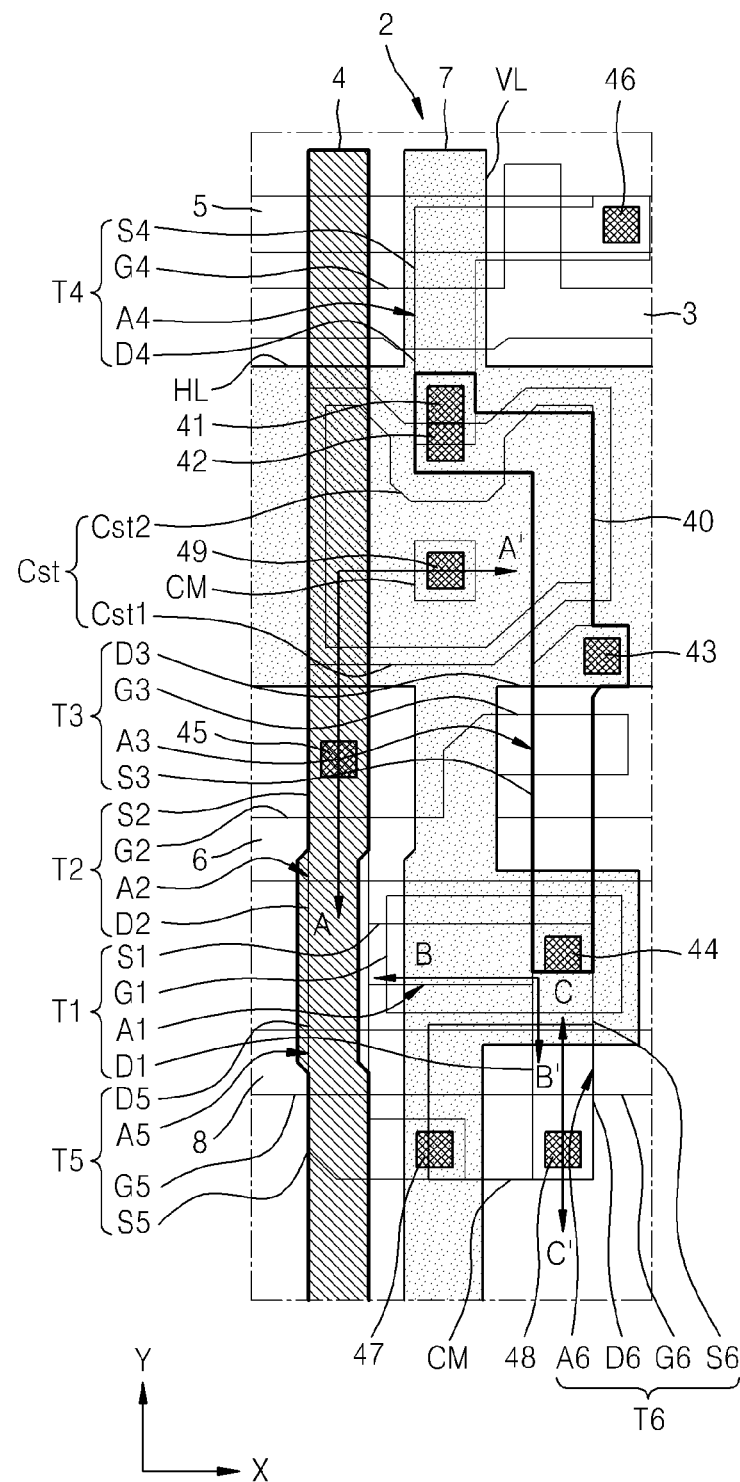
FIG. 7 is a plane view illustrating any one of first through third pixel circuits of FIG. 6, according to an embodiment of the present invention.

FIG. 7 is a plane view illustrating any one of the first through third pixel circuits 2R, 2G, and 2B of FIG. 6, according to an embodiment of the present invention. A pixel circuit 2 illustrated in FIG. 7 may be equally applied to the red sub-pixel R, the green sub-pixel G, and the blue sub-pixel B.

As illustrated in FIG. 7, the pixel circuit 2 includes a first scan line 6, a second scan line 3, an emission control line 8, and an initialization voltage line 5 that are formed in a first axis (the x-axis) direction and that apply a first scan signal Sn, a second scan signal Sn-1, an emission control signal En, and an initialization voltage VINT, respectively. Also, the pixel circuit 2 includes a data line 4 that is formed in a second axis (the y-axis) direction and crosses all of the first scan line 6, the second scan line 3, the emission control line 8, and the initialization voltage line 5, and that applies a data signal Dm to a pixel. In addition, the pixel circuit 2 includes a driving voltage line 7 that applies a first power voltage ELVDD.

The driving voltage line 7 includes a vertical line VL that is formed in the second axis direction so as to be substantially (or almost) parallel to the data line 4, and a horizontal line HL that is formed in the first axis direction so as to be substantially perpendicular to the data line 4. In one embodiment, the vertical line VL of the driving voltage line 7 is coupled with other vertical lines VL of other pixels that are adjacent in the second axis direction, and the horizontal line HL is coupled with other horizontal lines HL of the other pixels that are adjacent in the first axis direction and that cross the data line 4, so that the vertical lines VL and the horizontal lines HL have a mesh structure. The driving voltage line 7 is disposed at a layer between the storage capacitor Cst and the data line 4, thereby functioning as a metal shield. Also, in one embodiment the horizontal line HL of the driving voltage line 7 has an area that completely covers the storage capacitor Cst, and thus completely overlaps with the storage capacitor Cst.

According to an embodiment, the pixel circuit 2 includes a driving TFT T1, a switching TFT T2, a compensation TFT T3, an initialization TFT T4, a first emission control TFT T5, and a second emission control TFT T6.

The driving TFT T1 includes a semiconductor layer A1, a gate electrode G1, a source electrode S1, and a drain electrode D1. The source electrode S1 corresponds to a source region of the semiconductor layer A1 that is doped with impurities, and the drain electrode D1 corresponds to a drain region of the semiconductor layer A1 that is doped with impurities. The gate electrode G1 is coupled to a first electrode Cst1 of the storage capacitor Cst, a drain electrode D3 of the compensation TFT T3, and a drain electrode D4 of the initialization TFT T4 via contact holes 41 through 44 by using a coupling member 40. A projection portion that projects from the vertical line VL of the driving voltage line 7 is disposed on the gate electrode G1 of the driving TFT T1.

The switching TFT T2 includes a semiconductor layer A2, a gate electrode G2, a source electrode S2, and a drain electrode D2. The source electrode S2 corresponds to a source region of the semiconductor layer A2 that is doped with impurities, and the drain electrode D2 corresponds to a drain region of the semiconductor layer A2 that is doped with impurities. The source electrode S2 is coupled to the data line 4 via a contact hole 45. The gate electrode G2 is formed as a part of the first scan line 6.

The compensation TFT T3 includes a semiconductor layer A3, a gate electrode G3, a source electrode S3, and the drain electrode D3. The source electrode S3 corresponds to a source region of the semiconductor layer A3 that is doped with impurities, and the drain electrode D3 corresponds to a drain region of the semiconductor layer A3 that is doped with impurities. The gate electrode G3 is formed as dual gate electrodes by a part of the first scan line 6 and a part of an interconnection (or intercoupling) line that extends while projecting from the first scan line 6, so that the gate electrode G3 may prevent a leakage current.

The initialization TFT T4 includes a semiconductor layer A4, a gate electrode G4, a source electrode S4, and the drain electrode D4. The source electrode S4 corresponds to a source region of the semiconductor layer A4 that is doped with impurities, and the drain electrode D4 corresponds to a drain region of the semiconductor layer A4 that is doped with impurities. The source electrode S4 may be coupled to the initialization voltage line 5 via a contact hole 46. The gate electrode G4 is formed as a part of the second scan line 3.

The first emission control TFT T5 includes a semiconductor layer A5, a gate electrode G5, a source electrode S5, and a drain electrode D5. The source electrode S5 corresponds to a source region of the semiconductor layer A5 that is doped with impurities, and the drain electrode D5 corresponds to a drain region of the semiconductor layer A5 that is doped with impurities. The source electrode S5 may be coupled to the driving voltage line 7 via a contact hole 47. The gate electrode G5 is formed as a part of the emission control line 8.

The second emission control TFT T6 includes a semiconductor layer A6, a gate electrode G6, a source electrode S6, and a drain electrode D6. The source electrode S6 corresponds to a source region of the semiconductor layer A6 that is doped with impurities, and the drain electrode D6 corresponds to a drain region of the semiconductor layer A6 that is doped with impurities. The drain electrode D6 is coupled to an anode electrode of the OLED via a contact metal CM coupled to a contact hole 48 and a via hole VIA coupled to the contact metal CM. The gate electrode G6 is formed as a part of the emission control line 8.

The first electrode Cst1 of the storage capacitor Cst is coupled to all of the drain electrode D3 of the compensation TFT T3, the drain electrode D4 of the initialization TFT T4, and the gate electrode G1 of the driving TFT T1 by using the coupling member 40.

A second electrode Cst2 of the storage capacitor Cst is coupled to the driving voltage line 7 by using a contact metal CM formed in a contact hole 49, and thus receives a first power voltage ELVDD from the driving voltage line 7.

Figure 8:
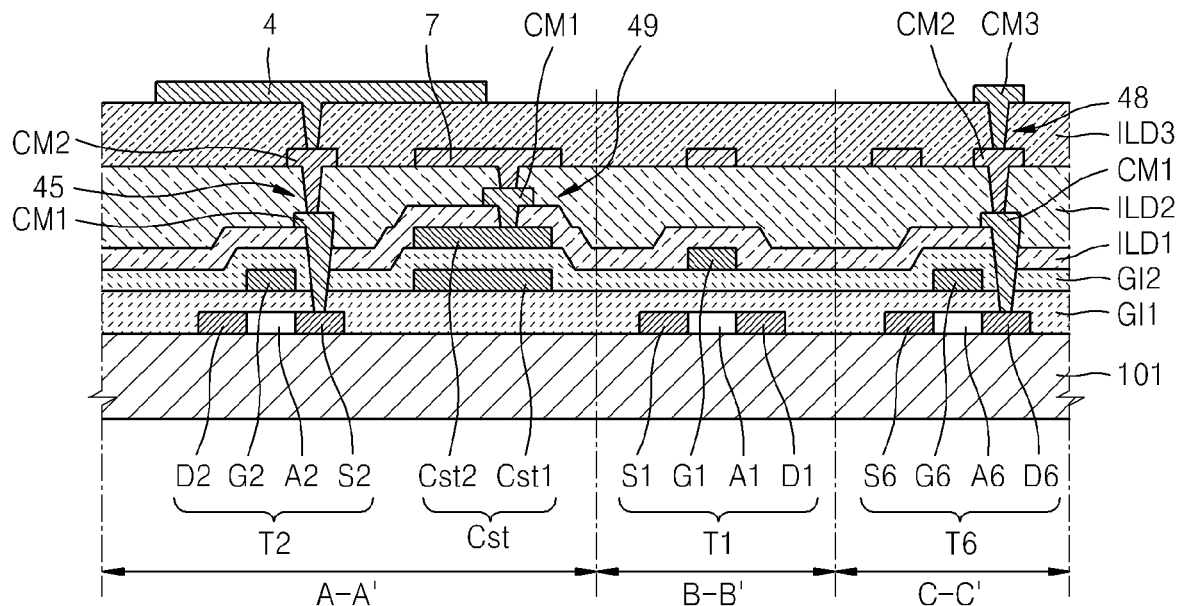
FIG. 8 is a cross-sectional view taken along the lines A-A', B-B', and C-C' shown in FIG. 7.

FIG. 8 is a cross-sectional view taken along the lines A-A', B-B', and C-C' shown in FIG. 7. FIG. 8 illustrates the driving TFT T1, the switching TFT T2, and the second emission control TFT T6 from among the TFTs T1 through T6 of the pixel circuit 2, and the storage capacitor Cst of the pixel circuit 2.

Referring to FIG. 8, the semiconductor layer A1 of the driving TFT T1, the semiconductor layer A2 of the switching TFT T2, and the semiconductor layer A6 of the second emission control TFT T6 are formed on the substrate 101. The aforementioned semiconductor layers A1, A2, and A6 may be formed of polysilicon, and include a channel region that is not doped with impurities, and a source region and a drain region that are formed at sides of the channel region and that are doped with impurities. Here, the impurities vary according to types of a TFT and may include N-type impurities or P-type impurities. Although not illustrated, the semiconductor layer A3 of the compensation TFT T3, the semiconductor layer A4 of the initialization TFT T4, and the semiconductor layer A5 of the first emission control TFT T5 may be concurrently (e.g., simultaneously) formed with the semiconductor layer A1, the semiconductor layer A2, and the semiconductor layer A6.

Although not illustrated, a buffer layer may be further formed between the substrate 101 and the semiconductor layers A1 through A6. The buffer layer may prevent diffusion of impurity ions and penetration of external moisture or air, and may function as a barrier layer and/or a blocking layer to planarize a surface.

The first gate insulating layer GI1 is stacked on the semiconductor layers A1 through A6 and above an entire surface of the substrate 101. The first gate insulating layer GI1 may be formed of an organic insulating material or an inorganic insulating material, or may have a multi-stack structure in which the organic insulating material and the inorganic insulating material are alternately formed.

The gate electrode G2 of the switching TFT T2, and the gate electrode G6 of the second emission control TFT T6 are formed on the first gate insulating layer GI1. Also, the first electrode Cst1 of the storage capacitor Cst is formed on the first gate insulating layer GI1. Although not illustrated, the gate electrode G3 of the compensation TFT T3, the gate electrode G4 of the initialization TFT T4, and the gate electrode G5 of the first emission control TFT T5 may be concurrently (e.g., simultaneously) formed from the same layer as the gate electrode G2 and the gate electrode G6. The gate electrode G2, the gate electrode G3, the gate electrode G4, the gate electrode G5, the gate electrode G6, and the first electrode Cst1 of the storage capacitor Cst may be formed of a first gate electrode material, and hereinafter, they are referred to as first gate electrodes. The first gate electrode material may include one or more metal materials selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first scan line 6, the second scan line 3, and the emission control line 8 may be concurrently (e.g., simultaneously) formed from the same layer as the first gate electrodes by using the first gate electrode material.

The second gate insulating layer GI2 is stacked on the first gate electrodes and above the entire surface of the substrate 101. The second gate insulating layer GI2 may be formed of an organic insulating material or an inorganic insulating material, or may have a multi-stack structure in which the organic insulating material and the inorganic insulating material are alternately formed.

The gate electrode G1 of the driving TFT T1 is formed on the second gate insulating layer GI2. Also, the second electrode Cst2 of the storage capacitor Cst is formed on the second gate insulating layer GI2. The gate electrode G1, and the second electrode Cst2 of the storage capacitor Cst may be formed of a second gate electrode material, and hereinafter, they are referred to as second gate electrodes. Similarly, as with the first gate electrode material, the second gate electrode material may include one or more metal materials selected from the group consisting of Al, Pt, Pd, Ag, Mg, Au, Ni, Nd, Ir, Cr, Li, Ca, Mo, Ti, W, and Cu.

The first interlayer insulating layer ILD1 is stacked on the second gate electrodes and above the entire surface of the substrate 101. The first interlayer insulating layer ILD1 may be formed of an organic insulating material or an inorganic insulating material, or may have a multi-stack structure in which the organic insulating material and the inorganic insulating material are alternately formed.

A first contact metal CM1 is formed at each of the contact holes 45, 48, and 49, and thus is coupled to each of the second electrode Cst2 of the storage capacitor Cst, the source electrode S2 of the switching TFT T2, and the drain electrode D6 of the second emission control TFT T6. The first contact metal CM1 may include one or more metal materials selected from the group consisting of Al, Pt, Pd, Ag, Mg, Au, Ni, Nd, Ir, Cr, Li, Ca, Mo, Ti, W, and Cu. The first contact metal CM1 may include a multi-stack metal layer, and in another embodiment, the first contact metal CM1 may have a three-layer structure of Ti/Al/Ti in which titanium is formed above and below Al. However, the present invention is not limited thereto and thus the first contact metal CM1 may have a multi-stack layer formed of various materials. Here, the initialization voltage line 5 may be formed on the first interlayer insulating layer ILD1 by using the first contact metal CM1.

The second interlayer insulating layer ILD2 is stacked on the first contact metal CM1 and above the entire surface of the substrate 101. The second interlayer insulating layer ILD2 may be formed of an organic insulating material or an inorganic insulating material, or may have a multi-stack structure in which the organic insulating material and the inorganic insulating material are alternately formed.

The driving voltage line 7 is formed on the second interlayer insulating layer ILD2 and is coupled to the second electrode Cst2 via the first contact metal CM1. Also, a second contact metal CM2 is formed at each of the contact holes 45 and 48 in the second interlayer insulating layer ILD2, and thus is coupled to each of the source electrode S2 of the switching TFT T2 and the drain electrode D6 of the second emission control TFT T6. The driving voltage line 7 and the second contact metal CM2 may include one or more metal materials selected from the group consisting of Al, Pt, Pd, Ag, Mg, Au, Ni, Nd, Ir, Cr, Li, Ca, Mo, Ti, W, and Cu. The second contact metal CM2 may include a multi-stack metal layer, and in another embodiment, the second contact metal CM2 may have a three-layer structure of Ti/Al/Ti in which titanium is formed above and below Al. However, the present invention is not limited thereto and thus the second contact metal CM2 may have a multi-stack layer formed of various materials.

The third interlayer insulating layer ILD3 is formed on the driving voltage line 7 and the second contact metal CM2, and above the entire surface of the substrate 101. The third interlayer insulating layer ILD3 may be formed of an organic insulating material or an inorganic insulating material, or may have a multi-stack structure in which the organic insulating material and the inorganic insulating material are alternately formed.

The data line 4 is formed on the third interlayer insulating layer ILD3. The data line 4 is coupled to the source electrode S2 of the switching TFT T2 via the first contact metal CM1 and the second contact metal CM2 in the contact hole 45. A part of the storage capacitor Cst overlaps with the data line 4, and the driving voltage line 7 is formed at the overlapping part between the data line 4 and the storage capacitor Cst. Also, a third contact metal CM3 is formed in the contact hole 48 in the third interlayer insulating layer ILD3, and thus is coupled to the drain electrode D6 of the second emission control TFT T6. The data line 4 and the third contact metal CM3 may include one or more metal materials selected from the group consisting of Al, Pt, Pd, Ag, Mg, Au, Ni, Nd, Ir, Cr, Li, Ca, Mo, Ti, W, and Cu. The third contact metal CM3 may include a multi-stack metal layer, and in another embodiment, the third contact metal CM3 may have a three-layer structure of Ti/Al/Ti in which titanium is formed above and below Al. However, the present invention is not limited thereto and thus the third contact metal CM3 may have a multi-stack layer formed of various materials.

In FIG. 8, source and drain electrodes from among the source and drain electrodes of the TFTs T1 through T6 and that are not coupled to other lines are formed from the same layers as the semiconductor layers A1 through A6, respectively. That is, the source and drain electrodes of each of the TFTs T1 through T6 may be formed of polysilicon selectively doped with dopants. However, embodiments of the present invention are not limited thereto, and thus, in another embodiment, respective source and drain electrodes of a TFT may be formed from respective layers different from a semiconductor layer, and may be coupled to respective source and drain regions of the semiconductor layer via respective contact holes.

Figure 9:
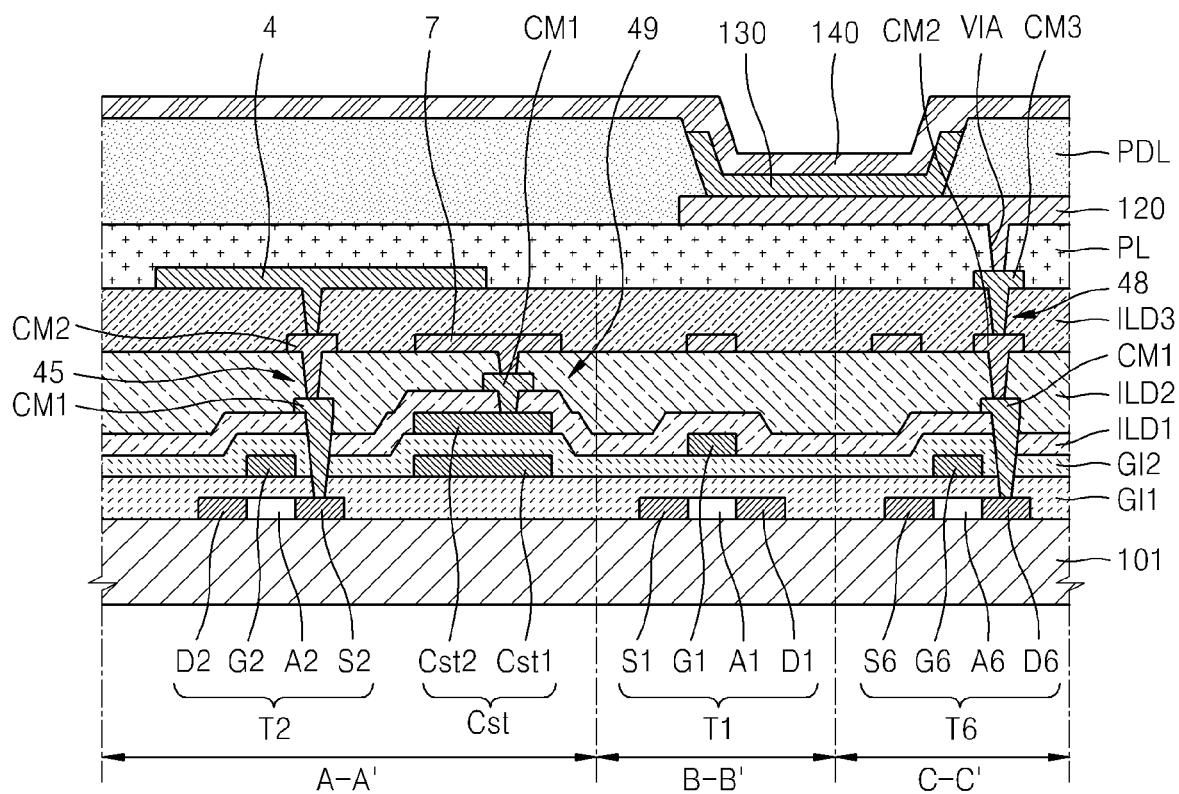
FIG. 9 is a cross-sectional view illustrating a form in which an organic light-emitting diode (OLED) is formed on the structure of FIG. 8.

FIG. 9 is a cross-sectional view illustrating a form in which an OLED is formed on the structure of FIG. 8.

Referring to FIG. 9, a planarization layer PL is formed on the substrate 101, on which the pixel circuit 2 is formed, to cover the data line 4 and the third contact metal CM3. The planarization layer PL may be formed to planarize a surface of the substrate 101 on which the TFTs T1 through T6 are formed, and may be formed as a single insulating layer or a multi-stack insulating layer. The planarization layer PL may include one or more materials selected from the group consisting of polyimide, polyamide, acryl resin, benzocyclobutene (BCB), and phenol resin. A via hole VIA may be formed in the planarization layer PL.

A pixel electrode 120 is formed on the planarization layer PL. The pixel electrode 120 is coupled to the third contact metal CM3 in the contact hole 48 via the via hole VIA, and thus is coupled to the drain electrode D6. The pixel electrode 120 corresponds to an anode electrode of the OLED.

A pixel definition layer PDL is formed on the pixel electrode 120, and the pixel definition layer PDL includes an opening for exposing a part of the pixel electrode 120. That is, the pixel electrode 120 includes an emission portion that is not covered by the pixel definition layer PDL, and a non-emission portion that is covered by the pixel definition layer PDL. The via hole VIA is disposed in the non-emission portion of the pixel electrode 120.

An organic layer 130, which includes an emissive layer, and an opposite electrode 140 are formed (e.g., sequentially formed) on the pixel electrode 120.

The organic layer 130 may have a structure in which an organic emissive layer (EML) and one or more layers from among function layers, such as a hole transport layer (HTL), a hole injection layer (HIL), an electron transport layer (ETL), and an electron injection layer (EIL), are stacked in a single or composite structure. The organic layer 130 may be formed of low molecular or high molecular organic matter. If the organic layer 130 emits red light, green light, and blue light, a red emissive layer, a green emissive layer, and a blue emissive layer may be formed by patterning the emissive layer. If the organic layer 130 emits white light, the emissive layer may have a multi-stack structure in which the red emissive layer, the green emissive layer, and the blue emissive layer are stacked, or may have a single layer structure that includes a red emissive material, a green emissive material, and a blue emissive material, so that the emissive layer may emit white light.

The opposite electrode 140 corresponds to a cathode electrode of the OLED.

Figure 10:
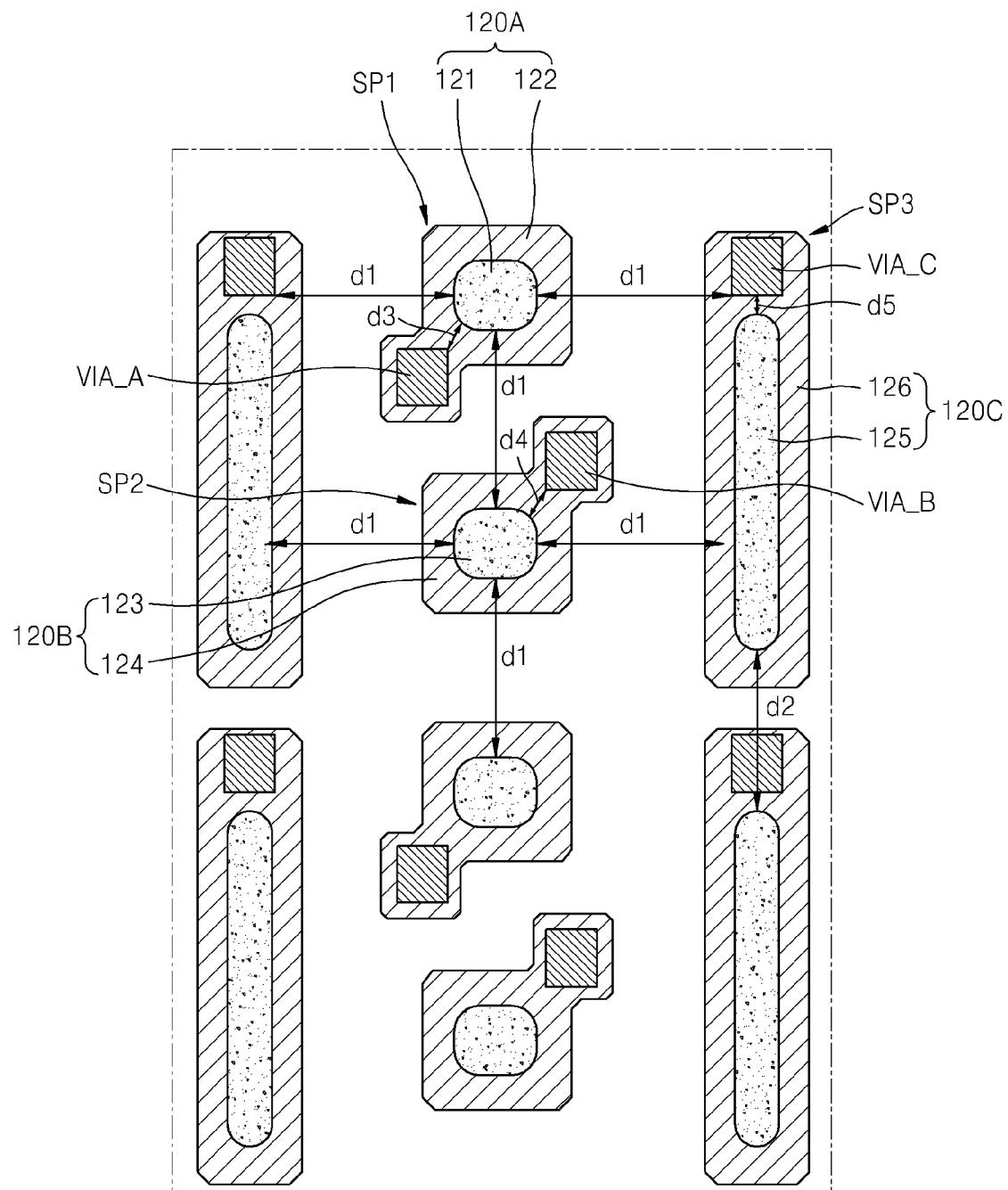
FIG. 10 is a diagram illustrating the arrangement of via holes of sub-pixels according to an embodiment of the present invention.

FIG. 10 is a diagram illustrating the arrangement of via holes of sub-pixels according to an embodiment of the present invention. In FIG. 10, the pixel circuit is omitted for convenience of explanation.

Referring to FIG. 10, a first pixel electrode 120A of a first sub-pixel SP1 may include a first emissive portion 121, in which an emissive layer is disposed, and a first non-emissive portion 122 around the first emissive portion 121. The first emissive portion 121 has a first area A1. The first non-emissive portion 122 is a portion that is covered by a pixel definition layer, and the first emissive layer 121 corresponds to an opening of the pixel definition layer. The first sub-pixel SP1 is disposed spaced apart (e.g., by a predetermined distance) from a second sub-pixel SP2 and a third sub-pixel SP3 that are adjacent to the first sub-pixel SP1 in the second axis (the y-axis) direction and the first axis (the x-axis) direction, respectively. In this case, the outermost edge of the first emissive portion 121 of the first sub-pixel SP1 is spaced apart by a first distance d1 from the outermost edge of a second emissive portion 123 of the second sub-pixel SP2 or the outermost edge of a third emissive portion 125 of the third sub-pixel SP3.

A second pixel electrode 120B of the second sub-pixel SP2 may include the second emissive portion 123, in which an emissive layer is disposed, and a second non-emissive portion 124 around the second emissive portion 123. The second emissive portion 123 has a second area A2. The second non-emissive portion 124 is a portion that is covered by a pixel definition layer, and the second emissive layer 123 corresponds to an opening of the pixel definition layer. The second sub-pixel SP2 is disposed spaced apart (e.g., by a predetermined distance) from the first sub-pixel SP1 and the third sub-pixel SP3 that are adjacent to the second sub-pixel SP2 in the second axis direction and the first axis direction, respectively. In this case, the outermost edge of the second emissive portion 123 of the second sub-pixel SP2 is spaced apart by the first distance d1 from the outermost edge of the first emissive portion 121 of the first sub-pixel SP1 or the outermost edge of the third emissive portion 125 of the third sub-pixel SP3.

A third pixel electrode 120C of the third sub-pixel SP3 may include the third emissive portion 125, in which an emissive layer is disposed, and a third non-emissive portion 126 around the third emissive portion 125. The third emissive portion 125 has a third area A3. The third non-emissive portion 126 is a portion that is covered by a pixel definition layer, and the third emissive layer 125 corresponds to an opening of the pixel definition layer. The third sub-pixel SP3 is disposed spaced apart (e.g., by a predetermined distance) from the first sub-pixel SP1 and the second sub-pixel SP2 that are adjacent to the third sub-pixel SP3 in the first axis direction. In this case, the outermost edge of the third emissive portion 125 of the third sub-pixel SP3 is spaced apart by the first distance d1 from the outermost edge of the first emissive portion 121 of the first sub-pixel SP1 or the outermost edge of the second emissive portion 123 of the second sub-pixel SP2. The outermost edges of the third emissive portions 125 of the third sub-pixels SP3 that are arranged to be adjacent to each other in the second axis direction are spaced apart by a second distance d2 from each other.

A first via hole VIA_A of the first sub-pixel SP1 does not overlap with the first emissive portion 121, and is formed to be shifted (e.g., by a predetermined distance) in a left lower direction from the first emissive portion 121. For example, the first via hole VIA_A of the first sub-pixel SP1 is formed at a position that is spaced apart by a third distance d3 in a downward direction of a third axis (z-axis), that is, in a left downward diagonal direction with respect to the first axis (x-axis) and the second axis (y-axis), from the outermost edge of the first emissive layer 121.

A second via hole VIA_B of the second sub-pixel SP2 does not overlap with the second emissive portion 123, and is formed to be shifted (e.g., by a predetermined distance) in a right upper direction from the second emissive portion 123. For example, the second via hole VIA_B of the second sub-pixel SP2 is formed at a position that is spaced apart by a fourth distance d4 in an upward direction of the third axis, that is, in a right upward diagonal direction with respect to the first axis and the second axis, from the outermost edge of the second emissive layer 123.

A third via hole VIA_C of the third sub-pixel SP3 does not overlap with the third emissive portion 125, and is formed on substantially (or about) the same vertical line as the third emissive portion 125. For example, the third via hole VIA_C of the third sub-pixel SP3 is formed at a position that is spaced apart by a fifth distance d5 in the upward direction of the second axis from the top outermost edge of the third emissive layer 125.

The third distance d3, the fourth distance d4, and the fifth distance d5 may satisfy a range of a separation distance between each emissive portion and each via hole, which may minimize dim spots in each sub-pixel.

The first via hole VIA_A of the first sub-pixel SP1 and the second via hole VIA_B of the second sub-pixel SP2 are spaced apart (e.g., by a predetermined distance) from each other in the first axis direction and the second axis direction and are disposed to be adjacent to each other. The first via hole VIA_A of the first sub-pixel SP1, the second via hole VIA_B of the second sub-pixel SP2, and the third via hole VIA_C of the third sub-pixel SP3 are formed at different positions in the same row.

The first sub-pixel SP1 may be a red sub-pixel R or a green sub-pixel G, and the second sub-pixel SP2 may be a green sub-pixel G or a red sub-pixel R. The third sub-pixel SP3 may be a blue sub-pixel B.

Figure 12:
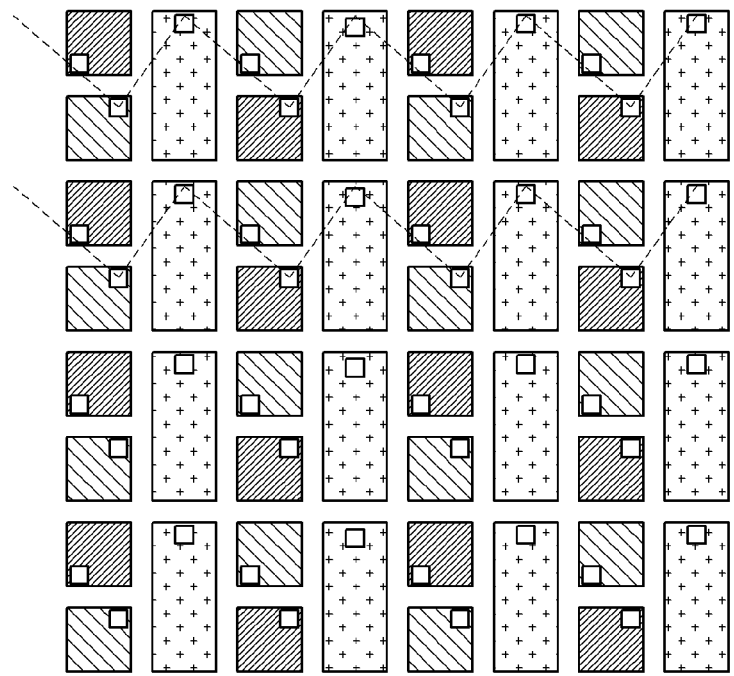
FIG. 12 is a diagram illustrating positions of via holes in the pixel arrangement structure of FIG. 1.
Figure 13:
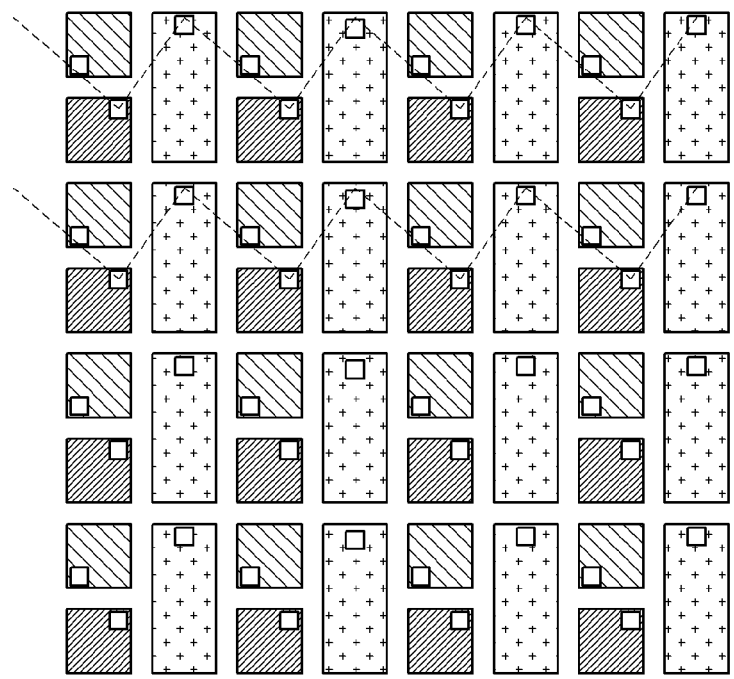
FIG. 13 illustrates positions of via holes in the pixel arrangement structure of FIG. 3.

FIGS. 12 and 13 schematically illustrate positions of via holes. FIG. 12 illustrates positions of via holes in the pixel arrangement structure of FIG. 1, and FIG. 13 illustrates positions of via holes in the pixel arrangement structure of FIG. 3. Referring to FIGS. 12 and 13, as shown by dotted lines, the via holes of the sub-pixels are formed in a zigzag pattern in the row direction.

Figure 11:
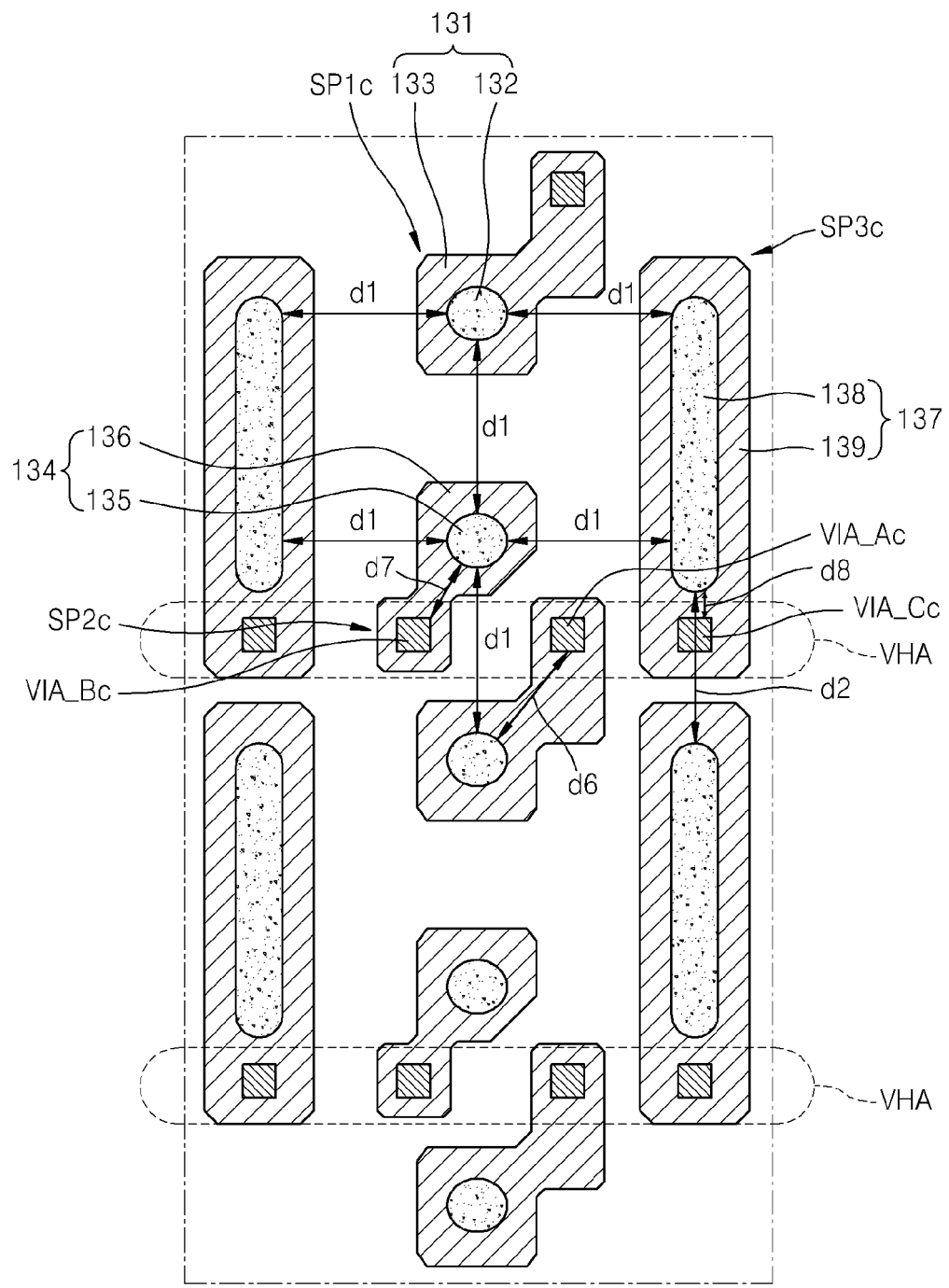
FIG. 11 is a diagram illustrating the arrangement of via holes of sub-pixels according to a comparison example.

FIG. 11 is a diagram illustrating the arrangement of via holes of sub-pixels according to a comparison example. In FIG. 11, the pixel circuit is omitted for convenience of explanation. When describing details of FIG. 11, detailed descriptions of the same elements as FIG. 11 may not be repeated.

Referring to FIG. 11, a first pixel electrode 131 of a first sub-pixel SP1c may include a first emissive portion 132 having an area A4 and a first non-emissive portion 133, a second pixel electrode 134 of a second sub-pixel SP2c may include a second emissive portion 135 having an area A5 and a second non-emissive portion 136, and a third pixel electrode 137 of a third sub-pixel SP3c may include a third emissive portion 138 having an area A6 and a third non-emissive portion 139. The first through third non-emissive portions 133, 136, and 139 are portions that are covered by a pixel definition layer, and the first through third emissive portions 132, 135, and 138 correspond to openings of the pixel definition layer.

A first via hole VIA_Ac of the first sub-pixel SP1c is formed at a position that is spaced apart by a sixth distance d6 in a upward direction of the third axis, that is, in a right upward diagonal direction with respect to the first axis and the second axis, from the outermost edge of the first emissive layer 132. A second via hole VIA_Bc of the second sub-pixel SP2c is formed at a position that is spaced apart by a seventh distance d7 in an downward direction of the third axis, that is, in a left downward diagonal direction with respect to the first axis and the second axis, from the outermost edge of the second emissive layer 135. A third via hole VIA_Cc of the third sub-pixel SP3c is formed at a position that is spaced apart by an eighth distance d8 in the downward direction of the second axis from the bottom outermost edge of the third emissive layer 138. A distance between the outermost edge of each of the first through third emissive portions 132, 135, and 138 is the first distance d1 or the second distance d2 as illustrated in FIG. 10.

When comparing the embodiment of the present invention of FIG. 10 and the comparison example of FIG. 11, in the comparison example, the second and third via holes VIA_Bc and VIA_Cc of the second and third sub-pixels SP2c and SP3c of an n-th row and the first via hole VIA_Ac of the first sub-pixel SP1c of an (n+1)-th row are arranged side by side in the first axis direction in a via hole area VHA between the n-th row and the (n+1)-th row. On the contrary, in the embodiment of the present invention of FIG. 10, the first through third via holes VIA_A, VIA_B, and VIA_C of the first through third sub-pixels SP1, SP2, and SP3 are formed at different positions in each row and not in the same via hole area.

Accordingly, the third distance d3 between the first via hole VIA_A and the first emissive portion 121 in the first sub-pixel SP1 of the embodiment of FIG. 10 may be shorter than the sixth distance d6 between the first via hole VIA_Ac and the first emissive portion 132 in the first sub-pixel SP1c of the comparison example of FIG. 11. In addition, the fourth distance d4 between the second via hole VIA_B and the second emissive portion 123 in the second sub-pixel SP2 of the embodiment of FIG. 10 may be shorter than the seventh distance d7 between the second via hole VIA_Bc and the second emissive portion 135 in the second sub-pixel SP2c of the comparison example of FIG. 11.

Accordingly, the size of the first pixel electrode 120A in the first sub-pixel SP1 of the embodiment of FIG. 10 may be formed to be larger than that of the first pixel electrode 131 in the first sub-pixel SP1c of the comparison example of FIG. 11, and the area A1 of the emissive portion 121 in the first sub-pixel SP1 of the embodiment of FIG. 10 may be formed to be larger than the area A4 of the first emissive portion 132 in the first sub-pixel SP1c of the comparison example of FIG. 11. In addition, the size of the second pixel electrode 120B in the second sub-pixel SP2 of the embodiment of FIG. 10 may be formed to be larger than that of the second pixel electrode 134 in the second sub-pixel SP2c of the comparison example of FIG. 11, and the area A2 of the emissive portion 123 in the second sub-pixel SP2 of the embodiment of FIG. 10 may be formed to be larger than the area A5 of the second emissive portion 135 in the second sub-pixel SP2c of the comparison example of FIG. 11.

On the contrary, the area A3 of the third emissive portion 125 in the third sub-pixel SP3 of the embodiment of FIG. 10 may be formed to be smaller than the size A6 of the third emissive portion 138 in the third sub-pixel SP3c of the comparison example of FIG. 11. Since the third sub-pixel SP3 has a larger area compared to the first sub-pixel SP1 and the second sub-pixel SP2, a reduction in the area A3 of the third emissive portion 125 of the third sub-pixel SP3 may be relatively small.

When the first sub-pixel SP1c, the second sub-pixel SP2c, and the third sub-pixel SP3c are formed as the red sub-pixel R, the green sub-pixel G, and the blue sub-pixel B, respectively, aperture ratios of the red sub-pixel R, the green sub-pixel G, and the blue sub-pixel B in the comparison example are about 3.48%, about 3.36%, and about 18.19%, respectively. On the contrary, when the first sub-pixel SP1, the second sub-pixel SP2, and the third sub-pixel SP3 are formed as the red sub-pixel R, the green sub-pixel G, and the blue sub-pixel B, respectively, under substantially the same manufacturing conditions, aperture ratios of the red sub-pixel R, the green sub-pixel G, and the blue sub-pixel B in an embodiment of the present invention are about 6.03%, about 6.03%, and about 16.44%, respectively. That is, in an embodiment of the present invention, the aperture ratio of the blue sub-pixel B is somewhat reduced, but the aperture ratios of the red sub-pixel R and the green sub-pixel G are increased and thus the entire aperture ratio is increased.

That is, according to embodiments of the present invention, a substantially constant distance, i.e., the first distance d1 or the second distance d2, between each of sub-pixels of different colors may be maintained. By maintaining the substantially constant distance between each of the sub-pixels, a shadowing effect in which a boundary between each of adjacent organic layers becomes vague during processes of forming the sub-pixels may be reduced (or prevented). In addition, in embodiments of the present invention, the areas of the red sub-pixel R and the green sub-pixel G and the sizes of the openings of the pixel definition layer may be formed to be relatively large compared to the comparison example. Accordingly, a higher (or high) aperture ratio may be obtained, and thus, a display device having a higher (or high) color reproduction rate and a higher (or high) resolution may be implemented.

While the present invention has been particularly shown and described with reference to example embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
a first pixel configured to display a first color in a first column;
a second pixel configured to display a second color and alternately located relative to the first pixel in the first column; and
a third pixel configured to display a third color in a second column adjacent to the first column,
wherein each of the first through third pixels comprises:
a pixel circuit;
a first electrode coupled to the pixel circuit;
a pixel definition layer on the first electrode and including an opening for exposing a part of the first electrode;
an emission layer on the first electrode;
a second electrode facing the first electrode; and
a via hole in an insulating layer between the pixel circuit and the first electrode, and exposing a portion of the pixel circuit, and
wherein an imaginary straight line connecting respective centers of via holes of the first pixel and the second pixel is between the openings of the first pixel and the second pixel, and the imaginary straight line does not cross the openings of the first pixel and the second pixel.

2. The organic light-emitting display device of claim 1, wherein a size of the first electrode of the first pixel and a size of the first electrode of the second pixel are smaller than a size of the first electrode of the third pixel.

3. The organic light-emitting display device of claim 1, wherein each of imaginary straight lines connecting centers of the via holes of two selected from the first pixel, the second pixel and the third pixel are not substantially parallel with a column direction and a row direction in a plan view.

4. The organic light-emitting display device of claim 1, wherein each of the via holes of the first through third pixels is overlapped with the respective first electrode.

5. The organic light-emitting display device of claim 1, wherein each of the via holes of the first through third pixels corresponds to a portion of the respective first electrode.

6. The organic light-emitting display device of claim 1, wherein the first electrode is connected to the pixel circuit through the via hole in the insulating layer.

7. An organic light-emitting display device comprising:
a first pixel configured to display a first color in a first column;
a second pixel configured to display a second color and alternately located relative to the first pixel in the first column;
a third pixel configured to display a third color in a second column adjacent to the first column; and
a fourth pixel configured to display the third color in a third column adjacent to the first column,
wherein each of the first through fourth pixels comprises:
a pixel circuit;
a first electrode coupled to the pixel circuit;
a pixel definition layer on the first electrode and including an opening for exposing a part of the first electrode;
an emission layer on the first electrode;
a second electrode facing the first electrode; and
a via hole in an insulating layer between the pixel circuit and the first electrode, and exposing a portion of the pixel circuit,
wherein a first imaginary straight line extending along a side of the opening of the first pixel, a second imaginary straight line extending along a side of the opening of the second pixel, a third imaginary straight line extending along a side of the opening of the third pixel, and a fourth imaginary straight line extending along a side of the opening of the fourth pixel define an imaginary quadrilateral, and
wherein the via hole of the first pixel and the via hole of the second pixel are in an area defined by the imaginary quadrilateral.

8. The organic light-emitting display device of claim 7, wherein the imaginary quadrilateral is a rectangle.

9. The organic light-emitting display device of claim 7, wherein the imaginary quadrilateral is between the opening of the first pixel and the opening of the second pixel, and wherein the imaginary quadrilateral is between the opening of the third pixel and the opening of the fourth pixel.

10. The organic light-emitting display device of claim 7, wherein the first electrode is connected to the pixel circuit through the via hole in the insulating layer.

11. The organic light-emitting display device of claim 7, wherein a size of the first electrode of the first pixel and a size of the first electrode of the second pixel are smaller than a size of the first electrode of the third pixel.

12. The organic light-emitting display device of claim 7, wherein the fourth pixel faces the third pixel.

13. An organic light-emitting display device comprising:
a first pixel configured to display a first color in a first column;
a second pixel configured to display a second color and alternately located relative to the first pixel in the first column;
a third pixel configured to display a third color in a second column adjacent to the first column; and a fourth pixel configured to display the third color in a third column adjacent to the first column, wherein each of the first through fourth pixels comprises:

a pixel circuit;

a first electrode coupled to the pixel circuit;

a pixel definition layer on the first electrode and including an opening for exposing a part of the first electrode;

an emission layer on the first electrode;

a second electrode facing the first electrode; and a via hole in an insulating layer between the pixel circuit and the first electrode, and exposing a portion of the pixel circuit, wherein a center of the opening of the first pixel, a center of the opening of the second pixel, a center of the opening of the third pixel, and a center of the opening of the fourth pixel define an imaginary quadrilateral, and wherein the via hole of the first pixel and the via hole of the second pixel overlap an area defined by the imaginary quadrilateral.

14. The organic light-emitting display device of claim 13, wherein the imaginary quadrilateral is a parallelogram.

15. The organic light-emitting display device of claim 13, wherein the first pixel is at least partially in an area defined by the imaginary quadrilateral.

16. The organic light-emitting display device of claim 13, wherein the second pixel is at least partially in an area defined by the imaginary quadrilateral.

17. The organic light-emitting display device of claim 13, wherein the second pixel is completely in an area defined by the imaginary quadrilateral.

18. The organic light-emitting display device of claim 13, wherein a size of the first electrode of the first pixel and a size of the first electrode of the second pixel are smaller than a size of the first electrode of the third pixel.

19. The organic light-emitting display device of claim 13, wherein the first electrode is connected to the pixel circuit through the via hole in the insulating layer.

20. The organic light-emitting display device of claim 13, wherein the fourth pixel faces the third pixel.

* * * * *